US009721940B2

United States Patent
Plössl et al.

(10) Patent No.: US 9,721,940 B2
(45) Date of Patent: Aug. 1, 2017

(54) RADIATION-EMITTING SEMICONDUCTOR CHIP AND METHOD OF PRODUCING RADIATION-EMITTING SEMICONDUCTOR CHIPS

(71) Applicant: OSRAM Opto Semiconductors GmbH, Regensburg (DE)

(72) Inventors: Andreas Plössl, Regensburg (DE); Heribert Zull, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/026,490

(22) PCT Filed: Aug. 29, 2014

(86) PCT No.: PCT/EP2014/068403
§ 371 (c)(1),
(2) Date: Mar. 31, 2016

(87) PCT Pub. No.: WO2015/049079
PCT Pub. Date: Apr. 9, 2015

(65) Prior Publication Data
US 2016/0218097 A1   Jul. 28, 2016

(30) Foreign Application Priority Data

Oct. 1, 2013   (DE) .................. 10 2013 110 853

(51) Int. Cl.
*H01L 21/00* (2006.01)
*H01L 27/02* (2006.01)
(Continued)

(52) U.S. Cl.
CPC ........ *H01L 27/0255* (2013.01); *H01L 25/167* (2013.01); *H01L 33/06* (2013.01);
(Continued)

(58) Field of Classification Search
CPC ......... H01L 27/02; H01L 25/16; H01L 33/38; H01L 33/62; H01L 33/06; H01L 33/30
See application file for complete search history.

(56) References Cited

U.S. PATENT DOCUMENTS

| 2006/0056123 A1 | 3/2006 | Aoyagi et al. |
| 2008/0029761 A1 | 2/2008 | Peng |

(Continued)

FOREIGN PATENT DOCUMENTS

| DE | 10 2007 019 776 A1 | 10/2008 |
| DE | 10 2007 062 046 A1 | 6/2009 |

(Continued)

OTHER PUBLICATIONS

Jani Karttunen et al., "Loading effects in deep silicon etching," Proceedings of SPIE 2000, vol. 4174, pp. 90-97.

(Continued)

*Primary Examiner* — Charles Garber
*Assistant Examiner* — Abdulfattah Mustapha
(74) *Attorney, Agent, or Firm* — DLA Piper LLP (US)

(57) ABSTRACT

A radiation-emitting semiconductor chip having a semiconductor body including a semi-conductor layer sequence having an active region that generates radiation, a first semiconductor layer of a first conductor, and a second semiconductor layer of a second conductor different from the first conductor, and having a carrier on which the semiconductor body is arranged, wherein a pn junction is formed in the carrier, the carrier has a first contact and a second contact on a rear side facing away from the semiconductor body, and the active area and the pn junction connect to one another in antiparallel in relation to the forward-bias direction by the first contact and the second contact.

19 Claims, 5 Drawing Sheets

(51) Int. Cl.
  H01L 25/16    (2006.01)
  H01L 33/38    (2010.01)
  H01L 33/62    (2010.01)
  H01L 33/06    (2010.01)
  H01L 33/30    (2010.01)
  H01L 33/00    (2010.01)
  H01L 33/48    (2010.01)

(52) U.S. Cl.
  CPC .......... H01L 33/30 (2013.01); H01L 33/382 (2013.01); H01L 33/62 (2013.01); *H01L 33/0079* (2013.01); *H01L 33/486* (2013.01); *H01L 2924/0002* (2013.01); *H01L 2933/0066* (2013.01)

(56) References Cited

U.S. PATENT DOCUMENTS

2009/0159918 A1    6/2009   Keller et al.
2012/0223416 A1*   9/2012   Scheubeck ............ H01L 25/167
                                                        257/603
2013/0087823 A1    4/2013   Tsai et al.

FOREIGN PATENT DOCUMENTS

| | | |
|---|---|---|
| DE | 10 2009 053 064 A1 | 5/2011 |
| DE | 10 2011 011 378 A1 | 8/2012 |
| DE | 10 2013 109 316 A1 | 12/2014 |
| EP | 2 405 491 A2 | 1/2012 |
| WO | 2013/021305 A1 | 2/2013 |
| WO | 2014/040993 A1 | 3/2014 |

OTHER PUBLICATIONS

Xuejun Fan, "Wafer Level System Packaging and Integration for Solid State Lighting (SSL)," 13$^{th}$ International Conference on Thermal, Mechanical and Multi-Physics Simulation and Experiements in Microelectronics and Microsystems; EuroSimE2012, pp. 1-6.

Akihiro Kojima et al., "A Fully Integrated Novel Wafer-Level LED Package (WL2P) Technology for Extremely Low-cost Solid State Lighting Devices," IEEE International Interconnect Technology Conference, IITC 2012, San Jose, Jun. 4-6, 2012.

* cited by examiner

RADIATION-EMITTING SEMICONDUCTOR CHIP AND METHOD OF PRODUCING RADIATION-EMITTING SEMICONDUCTOR CHIPS

TECHNICAL FIELD

This disclosure relates to a radiation-emitting semiconductor chip and a method of producing radiation-emitting semiconductor chips.

BACKGROUND

Optoelectronic semiconductor chips, for example, luminescent diode semiconductor chips are often arranged in packages together with ESD protection diodes connected in parallel for protection against electrostatic discharge. However, such a structure requires a relatively large package so that the miniaturizability of such a package is restricted.

It could therefore be helpful to provide a particularly compact design that is insensitive to electrostatic discharge and a method with which such designs can be produced straightforwardly and reliably.

SUMMARY

We provide a radiation-emitting semiconductor chip having a semiconductor body including a semiconductor layer sequence having an active region that generates radiation, a first semiconductor layer of a first conductor, and a second semiconductor layer of a second conductor different from the first conductor, and having a carrier on which the semiconductor body is arranged, wherein a pn junction is formed in the carrier, the carrier has a first contact and a second contact on a rear side facing away from the semiconductor body, and the active region and the pn junction connect to one another in antiparallel in relation to the forward-bias direction by the first contact and the second contact.

We also provide a method of producing a multiplicity of radiation-emitting semiconductor chips including a) providing a semiconductor layer sequence having an active region that generates radiation, a first semiconductor layer of a first conductor, and a second semiconductor layer of a second conductor different from the first conductor, b) fastening a carrier assembly in which a pn junction is formed on the semiconductor layer sequence, c) forming a multiplicity of vias from a rear side of the carrier assembly facing away from the semiconductor layer sequence through the carrier assembly, d) forming a multiplicity of first contacts and second contacts on the rear side of the carrier, the first contacts electrically conductively connected to the first semiconductor layer by the vias, and e) dividing the semiconductor layer sequence with the carrier assembly into semiconductor chips, the active region and the pn junction respectively connected to one another in antiparallel in relation to the forward-bias direction by the first contact and the second contact in the semiconductor chips.

We further provide a radiation-emitting semiconductor chip having a semiconductor body including a semiconductor layer sequence having an active region that generates radiation, a first semiconductor layer of a first conductor, and a second semiconductor layer of a second conductor different from the first conductor, and having a carrier on which the semiconductor body is arranged, wherein a pn junction is formed in the carrier, the carrier has a first contact and a second contact on a rear side facing away from the semi- conductor body, the active region and the pn junction connect to one another in antiparallel in relation to the forward-bias direction by the first contact and the second contact, pn junction is formed over the entire area of the carrier between a first subregion and a second subregion of the carrier, the first subregion arranged between the semiconductor body and the second subregion, and the carrier includes an opening extending from the rear side of the carrier through the second subregion and ending in the first subregion, and the first subregion electrically connect via the opening.

DETAILED DESCRIPTION

We provide a radiation-emitting semiconductor chip.

The semiconductor chip may have a semiconductor body. The semiconductor body may comprise a semiconductor layer sequence having an active region that generates radiation. The semiconductor layer sequence furthermore may comprise, in particular, a first semiconduc-tor layer of a first conduction type, and a second semiconductor layer of a second conduction type different from the first conduction type. For example, the first semiconductor layer may be n-conductively doped and the second semiconductor layer may be p-conductively doped, or vice versa. The active region may in particular be arranged between the first semiconductor layer and the second semiconductor layer. The active region, the first semiconductor layer and the second semiconductor layer may also respectively be configured in multilayered fashion.

The semiconductor chip may have a carrier. The carrier is thus part of the semiconductor chip. The carrier is used, in particular, to mechanically stabilize the semiconductor body.

A pn junction may be formed in the carrier. In contrast to the active region, the pn junction is not configured to generate electromagnetic radiation. The carrier may thus also be made of a material not suitable for radiation generation. For example, the carrier may contain silicon or germanium or consist of such a material.

In a vertical direction, the carrier extends between a rear side facing away from the semiconductor body and a front side facing toward the semiconductor body.

The carrier may have a first contact and a second contact on the rear side. The contacts are intended for external electrical contacting of the radiation-emitting semiconductor chip. By application of an external electrical voltage between these contacts, charge carriers can be injected into the active region from different sides and recombine there with emission of radiation.

The active region and the pn junction may connect to one another in antiparallel in relation to the forward-bias direction by the first contact and the second contact. In a forward voltage applied in relation to the active region, the pn junction is oriented in the reverse-bias direction so that the charge carriers are injected into the active region and recombine there with emission of radiation. In a voltage applied to the active region in the reverse direction, however, for example, because of an electrostatic charge, the pn junction is oriented in the forward-bias direction so that the charge carriers can flow away through the pn junction while avoiding the active region.

The semiconductor chip may have a semiconductor body comprising a semiconductor layer sequence having an active region that generates radiation, a first semiconductor layer of a first conduction type, and a second semiconductor layer of a second conduction type different from the first conduction type. The semiconductor chip furthermore may have a carrier on which the semiconductor body is arranged and a pn junction formed in the carrier. The carrier has a first contact and a second contact on a rear side facing away from the semiconductor body. The active region and the pn junction connect to one another in antiparallel in relation to the forward-bias direction by the first and second contacts.

The radiation-emitting semiconductor chip thus has ESD (ElectroStatic Discharge) protection integrated into the semiconductor chip in the form of a pn junction formed in the carrier of the semiconductor chip. Additional protection against electrostatic discharge, formed outside the semiconductor chip, may therefore be omitted. Furthermore, the semiconductor chip can be electrically contacted by the contacts arranged on the rear side, and can be fastened by standard processes, for example, reflow soldering on a terminal carrier, for example, a printed circuit board or a lead frame. In particular, the radiation-emitting semiconductor chip is configured as a so-called "CSP" (Chip Size Package) component. Such a design is particularly compact compared to components in which the semiconductor chips are mounted in a package together with additional ESD diodes. Furthermore, the semiconductor chip is a surface-mountable component (Surface Mount Device, SMD).

The pn junction may be formed in the carrier over its entire area. This means that, in plan view of the semiconductor chip, the pn junction extends over all of the carrier material. No lateral structuring processes are thus necessary to produce a carrier having such a pn junction.

The pn junction extends, in particular, parallel to the rear side of the carrier.

The pn junction may be formed between a first subregion of the carrier and a second subregion of the carrier. In particular, the first subregion is arranged between the semiconductor body and the second subregion. The first and second subregions are different from one another in relation to the conduction type. For example, the first subregion is p-conductive and the second subregion is n-conductive, or vice versa.

The carrier may have an opening extending from the rear side of the carrier through the second subregion, the first subregion being electrically contacted by the opening. For example, the opening is configured as a blind hole in the carrier. The opening thus does not extend fully through the carrier in the vertical direction. By the opening, the subregion of the pn junction facing toward the semiconductor body can thus be electrically contacted from the rear side of the carrier.

The first contact may electrically conductively connect to the first semiconductor layer by a via through the carrier. The via extends fully through the carrier in the vertical direction. Alternatively or additionally, the second contact electrically conductively connects to the second semiconductor layer by a via through the carrier. Instead of by a via, however, one of the contacts may also electrically conductively connect directly to the associated semiconductor layer by the expediently electrically conductive material of the carrier.

The via may extend through the pn junction. In electrical contacting of the first and second contacts, respectively by a via, the two vias may extend through the pn junction. In the region of the via, the contacts are expediently each electrically insulated from the pn junction. In particular, the pn junction may extend around the via along the entire circumference.

For example, the pn junction is electrically insulated from the first contact and/or from the second contact by an electrically insulating separating layer.

We also provide a method of producing a multiplicity of radiation-emitting semiconductor chips. The method described below is particularly suitable for producing a radiation-emitting semiconductor chip as described above. Features mentioned in connection with the semiconductor chip may therefore also be used for the method, and vice versa.

The method may comprise a step in which a semiconductor layer sequence having an active region that generates radiation, a first semiconductor layer of a first conduction type, and a second semiconductor layer of a second conduction type different from the first conduction type, is provided the semiconductor layer sequence is, for example, deposited epitaxially on a growth substrate, for instance by MOVPE. The semiconductor layer sequence may be provided on the growth substrate or on an auxiliary carrier different to the growth substrate.

The method may comprise a step in which a carrier assembly is fastened on the semiconductor layer sequence. In particular, a pn junction is formed in the carrier assembly.

The method may comprise a step in which a multiplicity of vias are formed from a rear side of the carrier assembly, facing away from the semiconductor layer sequence, through the carrier assembly. Formation of the vias is carried out, in particular, after the carrier assembly has already been fastened on the semiconductor layer sequence. At the time of fastening on the semiconductor layer sequence, the carrier assembly may be configured fully unstructured in the lateral direction. In particular, the carrier assembly may be entirely free of recesses or hollows extending fully or partially through the carrier assembly in the vertical direction.

The method may comprise a step in which a multiplicity of first contacts and second contacts are formed on the rear side of the carrier. The first contacts electrically conductively connect to the first semiconductor layer by the vias. Alternatively or additionally, the second contacts may electrically conductively connect to the second semiconductor layer by vias.

The method may comprise a step in which the semiconductor layer sequence with the carrier assembly is divided into semiconductor chips. In the divided semiconductor chips, the active region and the pn junction respectively connect to one another in antiparallel in relation to the forward-bias direction by the first and second contacts. The divided semiconductor chips, respectively, have a semiconductor body derived from the semiconductor layer sequence and a carrier derived from the carrier assembly.

The method may furthermore comprise the following steps:
  providing a semiconductor layer sequence having an active region that generates radiation, a first semiconductor layer of a first conduction type, and a second semiconductor layer of a second conduction type different from the first conduction type;
  fastening a carrier assembly in which a pn junction is formed on the semiconductor layer sequence;

forming a multiplicity of vias from a rear side of the carrier assembly facing away from the semiconductor layer sequence and through the carrier assembly;

forming a multiplicity of first contacts and second contacts on the rear side of the carrier, the first contacts electrically conductively connected to the first semiconductor layer by the vias; and dividing the semiconductor layer sequence with the carrier assembly into semiconductor chips, the active region and the pn junction, respectively, connected to one another in antiparallel in relation to the forward-bias direction by the first and second contacts in the semiconductor chips.

The divided semiconductor chips, respectively, have a semiconductor body and a carrier, respectively derived from the carrier assembly and the semiconductor layer sequence.

The method is preferably carried out in the indicated order of the production steps.

With the described method, semiconductor chips in which ESD protection is integrated into the carrier of the divided semiconductor chips may be produced. At the time when the semiconductor layer sequence is fastened on the carrier assembly, the carrier assembly may be fully unstructured in the lateral direction so that even approximate alignment of the semiconductor layer sequence relative to the carrier assembly, for example, by a mechanical stop, is sufficient. For example, deviation in the alignment may even be greater than the lateral extent of the semiconductor chip to be produced without the yield being reduced. Method steps, for example, photolithographic structuring steps in which more accurate alignment is required compared thereto, are not used for structuring the carrier assembly until after the carrier assembly has already been fastened on the semiconductor layer sequence.

By virtue of the pn junction formed in the carrier assembly, the semiconductor chips can furthermore already be protected against an electrostatic discharge at the time when the semiconductor layer sequence with the carrier assembly is divided into semiconductor chips.

The method may comprise a step in which, before fastening the carrier assembly on the semiconductor layer sequence, first connection surfaces electrically conductively connected to the first semiconductor layer, are formed on the semiconductor layer sequence. After the fastening of the carrier assembly on the semiconductor layer sequence, the first connection surfaces are exposed. In other words, the vias are configured such that the first connection surfaces are accessible for electrical contacting of the first semiconductor layer.

The semiconductor layer sequence may be covered over its entire area with a dielectric layer on a side facing toward the carrier assembly during fastening of the carrier assembly on the semiconductor layer sequence. On the side facing toward the carrier assembly, the dielectric layer is configured in particular in a planar fashion. In particular, the dielectric layer is free of steps. To flatten out irregularities, which may occur, for example, because of overmolded edges, the dielectric layer may be planarized, for example, by chemical-mechanical polishing before fastening the carrier assembly.

The carrier assembly may be fastened on the semiconductor layer sequence by direct bonding. This step may, in particular, be carried out at room temperature. A bonding layer such as an adhesive layer or a solder layer is not necessary in direct bonding.

As an alternative to direct bonding, however, fastening of the carrier assembly on the semiconductor layer sequence by a bonding layer such as a solder layer or an adhesive layer, may also be used.

Openings extending through the pn junction may be formed from the rear side in the carrier assembly. The openings may be formed, in particular, after the carrier assembly is already fastened on the semiconductor layer sequence. The openings and the vias may be formed in a common production step or in two production steps separated from one another in time.

The openings may have a smaller cross section than the vias in plan view so that the openings and the vias are configured during simultaneous production such that the vias extend through the carrier assembly and the openings end in the carrier assembly.

For formation of the vias and the openings, for example, an anisotropic etching method, for example, deep reactive ion etching (DRIE), or etching at low temperatures, is suitable. The etching rates of such processes depend on the cross section of the structures to be etched so that the etching rate for small cross sections is less than for large cross sections. This is described in the article Proceedings of SPIE 2000, Vol. 4174, pp 90-97; International Society of Optical Engineering (SPIE), the subject matter of which is explicitly incorporated herein by reference. The term deep reactive ion etching generally covers processes with which high aspect ratios can be achieved by dry chemical etching, for example, the so-called Bosch process or variants thereof. To remove the passivation layer, for example, an additional step with oxygen may be inserted between the conventionally used treatment steps with $C_4F_8$ and $SF_6$. Furthermore, variants are known in which etching and passivation are carried out simultaneously, which is also referred to as a "continuous process."

We found that, by adaptation of the cross sections of the openings and vias, the etching rate can be adjusted such that the vias and the openings have the respectively desired etching depth at a predetermined time. For example, the cross section of the vias is at least 20% greater than the cross section of the openings.

The pn junction may extend parallel to the rear side of the carrier assembly, and the pn junction may be arranged closer to the front side of the carrier assembly, facing toward the semiconductor layer sequence than to the rear side of the carrier assembly during fastening of the carrier assembly on the semiconductor layer sequence. For example, the pn junction is arranged at a distance of at most 50 μm from the front side of the carrier assembly. In particular, the pn junction may be formed very close to the front side. Preferably, the distance from the front side is at most 10 μm, particularly preferably at most 5 μm, most preferably at most 3 μm.

The carrier assembly may be thinned from the rear side between the fastening of the carrier assembly on the semiconductor layer sequence and formation of the vias. At the time when the carrier assembly is fastened the carrier assembly can thus have a high mechanical stability because of a relatively large thickness. After fastening, the carrier assembly may be thinned to reduce the thickness of the future carriers of the semiconductor chips. In this way, the outlay for formation of the vias is also reduced.

Further features, configurations and expediencies may be found in the following description of the examples.

Elements that are the same or of the same type, or have the same effect, are provided with the same references in the figures.

The figures and the size proportions of the elements represented in the figures with respect to one another are not to be regarded as true to scale. Rather, individual elements and in particular layer thicknesses may be represented exaggeratedly large for better representability and/or for better understanding.

Figure 1:
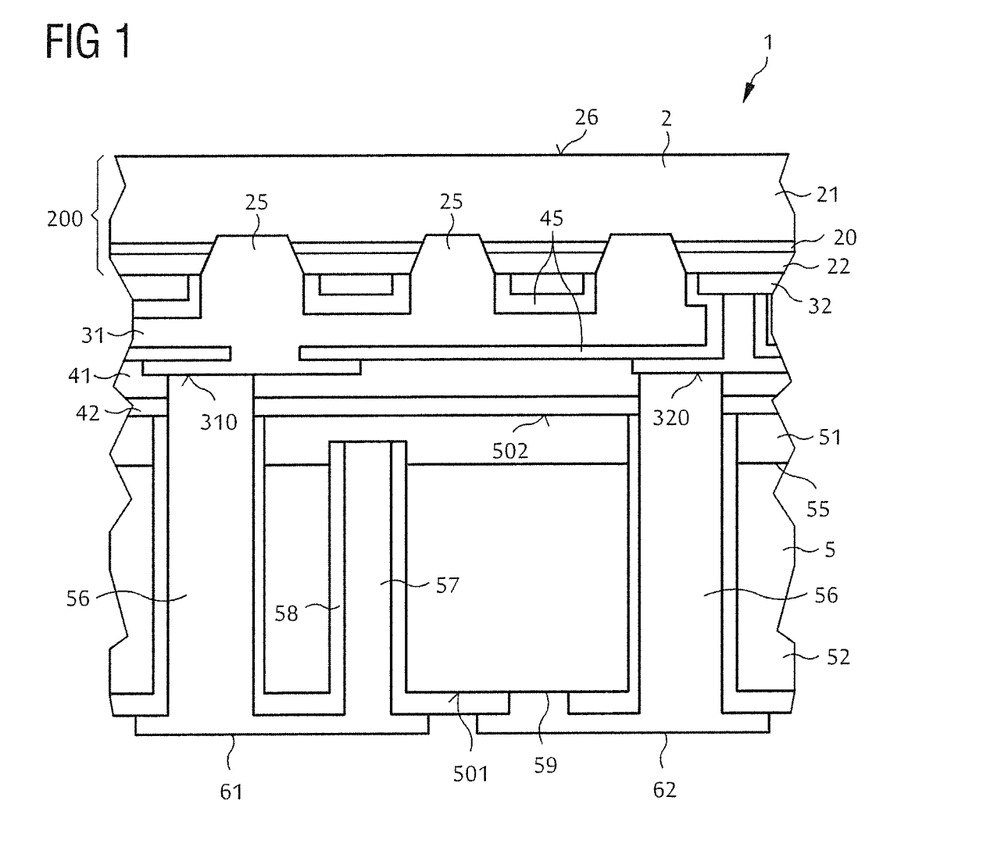
FIG. 1 shows an example of a radiation-emitting semiconductor chip with the aid of a detail in a schematic sectional view.

An example of a radiation-emitting semiconductor chip is schematically represented in a sectional view in FIG. 1, the edge regions of the semiconductor chip not shown for a simplified representation.

The radiation-emitting semiconductor chip is configured, for example, as a luminescent diode semiconductor chip, for instance as a light-emitting diode semiconductor chip. The radiation-emitting semiconductor chip 1 comprises a semiconductor body 2. The semiconductor body has a semiconductor layer sequence 200 with an active region 20 arranged between a first semiconductor layer 21 and a second semiconductor layer 22. For example, the first semiconductor layer 21 is configured to be n-conductive and the second semiconductor layer 22 is configured to be p-conductive, or vice versa.

The semiconductor body 2, in particular the active region 20, preferably comprises a III-V compound semiconductor material. III-V compound semiconductor materials are particularly suitable for radiation generation in the ultraviolet ($Al_xIn_yGa_{1-x-y}N$) through the visible ($Al_xIn_yGa_{1-x-y}N$, in particular for blue to green radiation, or $Al_xIn_yGa_{1-x-y}P$, in particular for yellow to red radiation) to the infrared ($Al_xIn_yGa_{1-x-y}As$) spectral range. In this case, respectively, $0 \leq x \leq 1$, $0 \leq y \leq 1$, and $x+y \leq 1$, in particular with $x \neq 1$, $y \neq 1$, $x \neq 0$ and/or $y \neq 0$. With III-V compound semiconductor materials, in particular comprising the material systems, high internal quantum efficiencies can furthermore be achieved in the radiation generation.

The semiconductor chip 1 furthermore comprises a carrier 5 fastened on the semiconductor body 2. The carrier 5 extends in a vertical direction between a rear side 501 facing away from the semiconductor body 2 and a front side 502 facing toward the semiconductor body. In the example shown, the mechanical connection is formed by a direct bond connection between a first dielectric layer 41 and a second dielectric layer 42. In contrast thereto, the semiconductor body 2 may, however, also be fastened on the carrier 5 by a bonding layer, for example, a solder layer or an adhesive layer.

The semiconductor body 2 has a multiplicity of recesses 25 extending from the side facing toward the carrier through the second semiconductor layer 22 and the active region 20. In the recesses, the first semiconductor layer electrically conductively connects to a first connection layer 31. A radiation emission surface 26, facing away from the carrier 5 of the semiconductor body 2 can therefore be entirely free of external electrical contacts so that the risk of masking is avoided.

The second semiconductor layer 22 electrically conductively connects to a second connection layer 32. The second connection layer 32, or at least a sublayer of the second connection layer, is configured as a mirror layer for the radiation generated in the active region 20 during operation. For example, the second connection layer 32, or a sublayer thereof, contains silver, palladium, aluminum, rhodium or nickel. The aforementioned materials are distinguished by a high reflectivity in the visible spectral range. In a plan view of the semiconductor chip 1, the second connection layer preferably covers at least 50%, preferably at least 75%, most preferably at least 80% of the base surface of the semiconductor body 2.

The second connection layer 32 locally extends in the vertical direction between the first connection layer 31 and the semiconductor body 2. The connection layers 31, 32 are in particular layers, for example, metal layers arranged outside the semiconductor body 2. Alternatively or additionally to a metal layer, the first connection layer 31 and/or the second connection layer 32, or at least one sublayer thereof, may contain a TCO (Transparent Conductive Oxide) material, or consist of such a material.

The first connection layer 31 and the second connection layer 32 are electrically insulated from one another by an insulation layer 45. The insulation layer 45 may also cover the side surfaces of the recesses 25 to avoid an electrical short circuit between the first connection layer and the second semiconductor layer 22. This is not explicitly shown for a simplified representation.

On a side facing toward the carrier 5, the first connection layer 31 and the second connection layer 32 respectively form a first connection surface 310 and a second connection surface 320. The first connection surface 310 and the second connection surface 320 are each electrically conductively connected by a via 56 through the carrier to a first contact 61 and a second contact 62, respectively. The contacts 61, 62 are formed on the rear side 501 of the carrier 5.

The carrier 5 has a pn junction 55. The pn junction is formed between a first subregion 51 and a second subregion 52. For example, the first subregion is p-conductive and the second subregion is n-conductive or vice versa. For example, the first subregion 51 may be p-conductively doped with boron.

The pn junction 55 runs parallel to the rear side 501 and extends in the lateral direction over the entire surface of the carrier 5. The first subregion 51 is arranged between the second subregion 52 and the semiconductor body 2 in the vertical direction.

There is an opening 57 formed in the carrier extending from the rear side of the carrier through the second subregion 52 and the pn junction, and ends in the first subregion 51. The first subregion connects to the first contact 61 in the opening. The first subregion has a conduction type different from the conduction type of the first semiconductor layer 21. Correspondingly, the second subregion 52 has a conduction type different to the conduction type of the second semiconductor layer 22. In a connection window 59 in which the second contact 62 adjoins the rear side 501 of the carrier 5, the second subregion electrically conductively connects to the second contact 62.

In this way, the pn junction 55 connects in antiparallel with the active region 20 in relation to the forward-bias direction. The active region 20 and the pn junction 55 can be electrically contacted externally by the first contact 61 and the second contact 62. The radiation-emitting semiconductor chip thus has precisely two external contacts. For electrical insulation of the carrier 5 from the vias 56 and the opening 57, the side surfaces of the vias and of the opening are provided with a separating layer 58.

In the example shown, the vias and the opening are fully filled with an electrically conductive material. In contrast thereto, however, only partial filling, for example, in the form of a cover-like coating of the side surfaces may be sufficient.

For the first dielectric layer 41, the second dielectric layer 42, the insulation layer 45 and the separating layer 58, for example, an oxide, for instance silicon oxide, or a nitride, for example, silicon nitride or a layer sequence having various dielectric layers, for example, a layer sequence of silicon oxide and silicon nitride are suitable.

The vias 56 extend through the pn junction 55 and are electrically insulated from the pn junction in the region of the pn junction by the separating layer 58.

In contrast to the example shown, the first connection layer 310 or the second connection layer 320 may also electrically conductively connect to the first contact 61 or, respectively, to the second contact 62, not by a via but by the carrier material itself. Furthermore, the pn junction 55 need not extend over the carrier 5 over its entire area. Furthermore, it is also possible for the pn junction to extend not parallel, but obliquely or perpendicularly to the rear side 501 of the carrier so long as the first subregion 51 and the second subregion 52 are each electrically contacted by one of the contacts. The described configuration is, however, particularly suitable with a view to particularly simple production of the semiconductor chip.

An example of a method of producing a radiation-emitting semiconductor chip is schematically shown in FIGS. 2A to 2E with the aid of intermediate steps represented in sectional views. In this case, by way of example, a semiconductor chip as described in connection with FIG. 1 is produced. For simplified representation, only a subregion of a semiconductor chip is shown. With the described method, a multiplicity of semiconductor chips can be produced simultaneously.

Figure 2A:
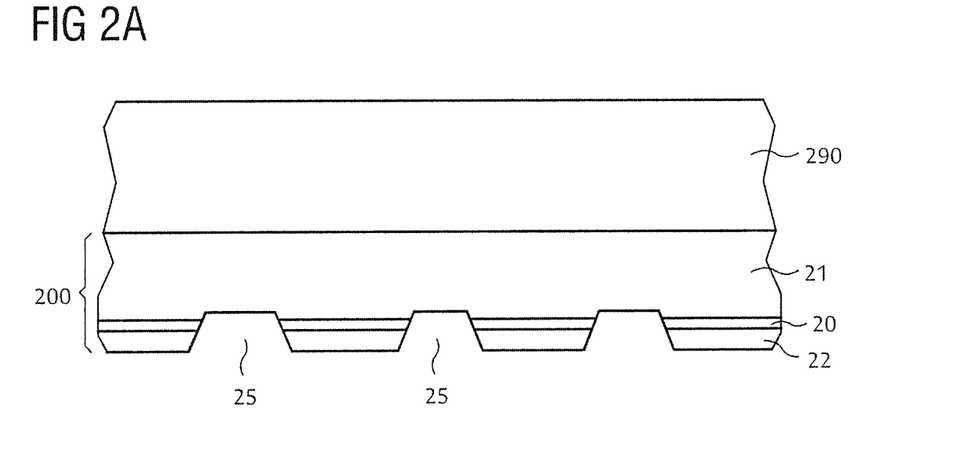
FIGS. 2A to 2E show an example of a method of producing radiation-emitting semiconductor chips with the aid of intermediate steps respectively represented in a schematic sectional view.

As represented in FIG. 2A, a semiconductor layer sequence 200 having an active region 20, a first semiconductor layer 21 and a second semiconductor layer 22 is provided. The semiconductor layer sequence 200 is, for example, arranged on a growth substrate 290. For example, sapphire or silicon is suitable as a growth substrate for a semiconductor layer sequence based on nitride compound semiconductor material.

In the semiconductor layer sequence, from the side facing away from the growth substrate 290, a multiplicity of recesses 25 extending through the second semiconductor layer 22 and the active region 20 are formed.

Figure 2B:
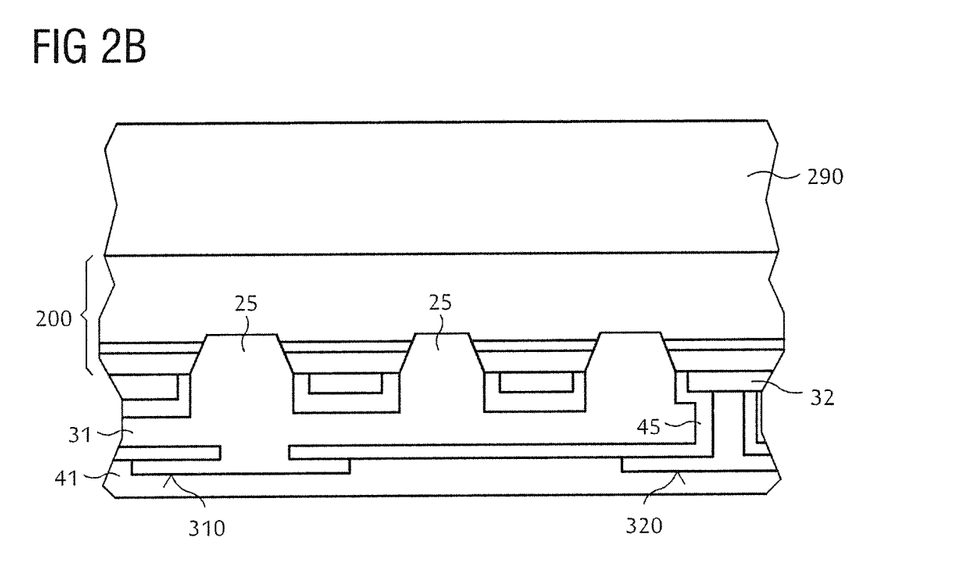

For electrical contacting of the first semiconductor layer 21 and the second semiconductor layer 22, as represented in FIG. 2B, first a second connection layer 32 and then a first connection layer 31 are formed. An insulation layer 45 is formed between the first connection layer 31 and the second connection layer 32. The first connection layer 31, the second connection layer 32 and the insulation layer 45 are respectively layers arranged outside of the prefabricated semiconductor layer sequence.

Figure 2C:
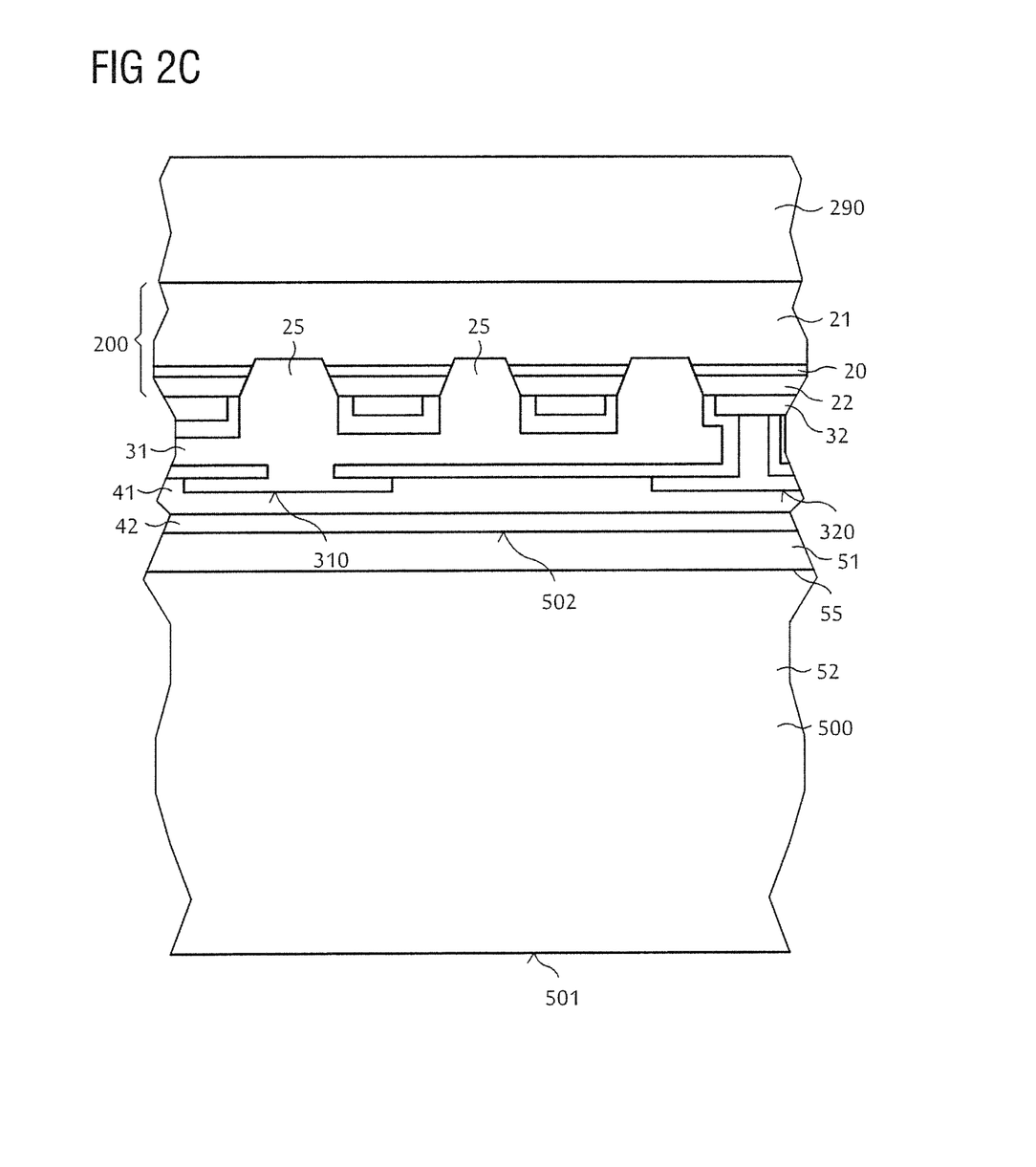

On the side of the semiconductor layer sequence 200 facing away from the growth substrate 290, the first connection layer 31 and the second connection layer 32 form a first connection surface 310 and a second connection surface 320, respectively. A first dielectric layer 41 is applied onto the connection layers. The first connection layer covers the semiconductor layer sequence over its entire area. The first dielectric layer 41 forms a planar surface for subsequent connection of the semiconductor layer sequence 200 to a carrier assembly (FIG. 2C).

If required, the dielectric layer 41 may be planarized, for example, by a CMP method.

A carrier assembly 500 is fastened on the semiconductor layer sequence 200 by direct bonding. On a front side 502 facing toward the semiconductor layer sequence 200, the carrier assembly 500 has a second dielectric layer 42, which is likewise configured in a planar fashion and has a very low surface roughness. The carrier assembly 500 has a pn junction 55 extending over the carrier assembly over its entire area. The carrier assembly 500 is overall fully unstructured in the lateral direction so that no particular alignment precautions need to be taken when producing the connection between the semiconductor layer sequence 200 and the carrier assembly 500. For example, a simple mechanical stop is sufficient for the relative alignment between the semiconductor layer sequence 200 and the carrier assembly 500.

The direct bonding may be carried out at room temperature. The contact between the first dielectric layer 41 and the second dielectric layer 42 gives rise to hydrogen bridge bonds connecting the two layers to one another. These bonds can be converted into strong chemical bonds in a condensation reaction at higher temperatures, for example, covalent or covalent-ionic bonds to permanently strengthen the adhesion forces.

Since the direct bond connection may be carried out at room temperature, the differently strong expansion coefficients between the growth substrate, for example, sapphire and the carrier assembly 500, for example, silicon lead to no curvature or only to curvature that does not impair the connection. To produce the direct bond connection, the carrier assembly expediently has a sufficiently large thickness to ensure sufficient mechanical stability during the joining process. For example, the thickness of the carrier assembly is at least 200 µm.

Figure 2D:
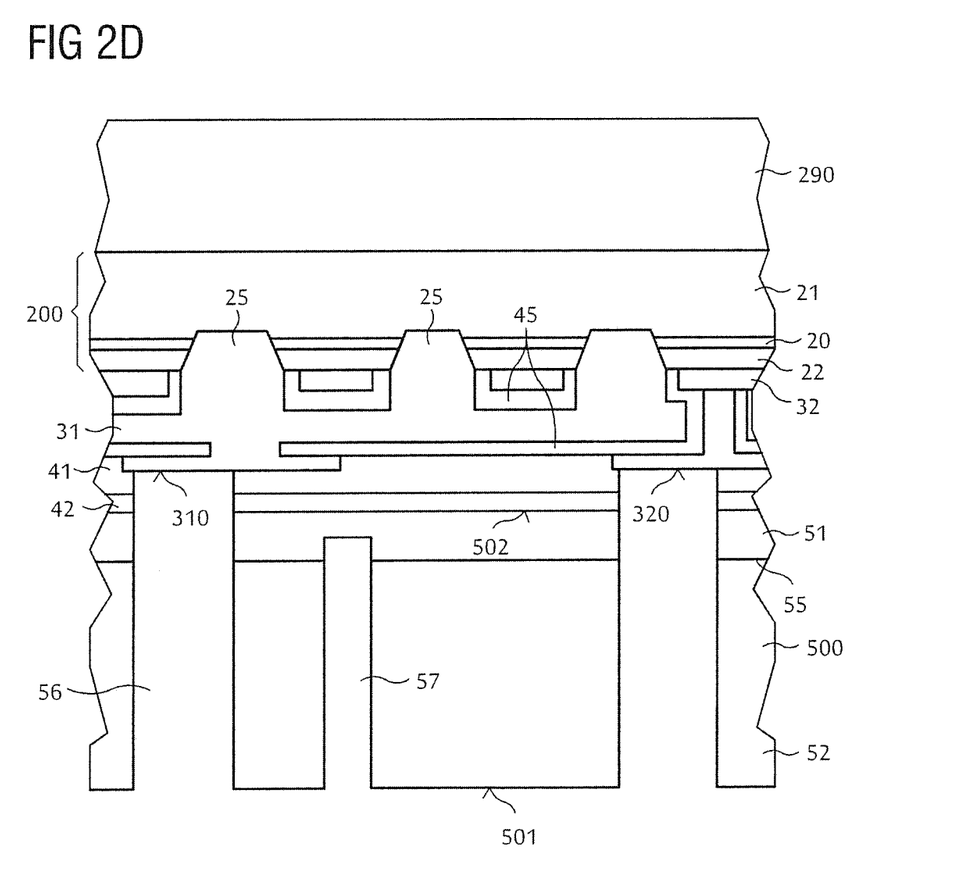

Subsequently, as represented in FIG. 2D, the carrier assembly 500 may be thinned from the rear side 501. The thickness of the carrier assembly after thinning is preferably 50 µm to 150 µm, for example, 80 µm.

The pn junction is arranged closer to the front side 502 than to the rear side 501 so that there is no risk of damage to the pn junction during the thinning of the carrier assembly. For example, to form the pn junction, it is possible to use a relatively weakly n-doped carrier assembly 500 in which, to form the first subregion 51, a p-conductive first subregion 51 is formed, for example, by implantation. Vias 56 are formed in the carrier assembly 500 from the rear side 501 after the thinning. This may be done by a photolithographic structuring method, the vias 56 being configured such that the first connection surfaces 310 and the second connection surfaces 320 are exposed. In a transparent growth substrate 290, the alignment of the photolithographic method may be carried out through the growth substrate. In a radiation-opaque growth substrate, for example, silicon as an alternative thereto, a suitable alignment structure (not explicitly represented) may be provided on the rear side of the growth substrate.

To form the vias 56, for example, an anisotropic etching method, for example, deep reactive ion etching or etching at low temperatures, may be used. Furthermore, openings 57 extending through the second subregion 52 and the pn junction 55 into the first subregion 51, and end there, are formed in the carrier assembly 500 from the rear side 501 of the carrier assembly 500. The vias 56 and the openings 57 may be produced successively in separate production steps from one another. The etching depths for the vias 56 and the openings 57 may thereby be adjusted separately from one another. As an alternative, the vias 56 and the openings 57 may be formed in a common production step. To this end, the cross section of the openings 57 may be selected to be smaller than the cross section of the vias 56 so that, during the same dry chemical etching method, a higher etching rate occurs in the vias 56 than in the openings 57. For example, the vias 56 may be configured circularly with a diameter of about 60 µm and the openings 57 with a diameter of about 45 µm. Of course, values differing therefrom may also be selected for the vias and the openings.

Preferably, the cross-sectional area of the vias is at least 20% greater than the cross-sectional area of the openings 57.

To expose the first connection surfaces 310 and the second connection surfaces 320, the etching method may be selected such that it stops selectively on the metal connection surfaces. As an alternative, for example, optical endpoint identification may be carried out, for instance by optical emission spectroscopy (OES).

Figure 2E:
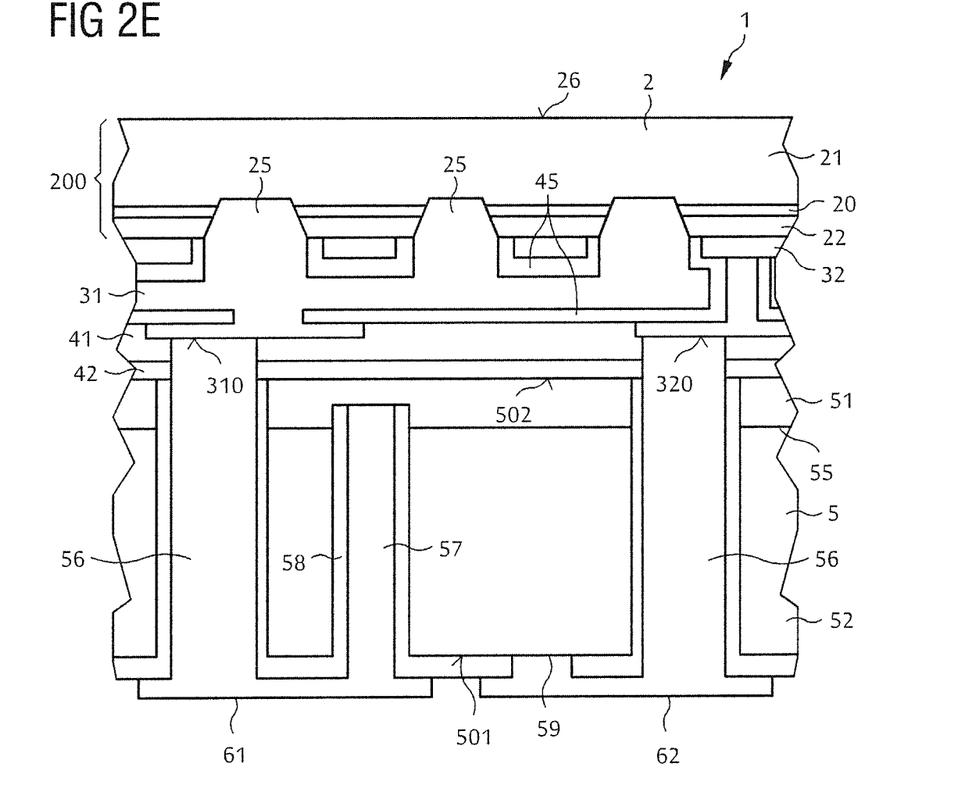

Subsequently, the side surfaces of the vias 56 and of the openings 57, as well as the rear side 501, are provided with an electrically insulating separating layer, for example, a silicon oxide layer or a silicon nitride layer, or a layer pair of silicon oxide and silicon nitride (FIG. 2E). To this end, for example, a CVD method such as PECVD (Plasma Enhanced Chemical Vapor Deposition) or atomic layer deposition (ALD) may be used. In further photolithographic structuring, the separating layer may be opened at the bottom of the openings 57 and, if necessary at the bottom of the vias 56 so that the first connection surfaces 310, the second connection surfaces 320 and the first subregion of the carrier assembly 500 are accessible for electrical contacting. Furthermore, a connection window 59, in which the rear side of the carrier assembly 500 is exposed for electrical contacting of the second subregion 52, is formed on the rear side 501.

An Ni/Au layer may, for example, be deposited and a resist mask may be defined on this layer to form the electrical contacts 61, 62. In the windows of this mask, the previously applied metal layer is electrochemically thickened, for example, with copper. After removal of the resist mask and the unthickened Ni/Au layer, the active region 20 and the pn junction 55 are externally electrically contacted by the first contacts 61 and the second contacts 62 and connect in antiparallel to one another. The carrier assembly 500 is now used for mechanical stabilization of the semiconductor layer sequence 200 so that the growth substrate 290 is no longer required for this and may be removed. The removal may, for example, be carried out by a laser lift-off method, mechanically or chemically.

The semiconductor layer sequence 200 with the carrier assembly 500 may now be divided, for example, by a mechanical method such as sawing, chemically or by laser separation to form individual semiconductor chips.

With the described method, a semiconductor chip can be produced in a straightforward and reliable way, particularly in a CSP structure particularly straightforwardly and economically at the wafer level so that an ESD protection diode is already integrated into the semiconductor chip when dividing into semiconductor chips. The finished semiconductor chips are thus surface-mountable components for which an additional package is not required. Furthermore, a finely aligned bonding process between the semiconductor layer sequence and the carrier assembly can be omitted so that this method can be carried out particularly straightforwardly and reliably with low rejection.

This application claims priority of DE 10 2013 110 853.9, the subject matter of which is hereby incorporated by reference.

Our chips and methods are not restricted by the description with the aid of the examples. Rather, this disclosure covers any new feature and any combination of features including in particular any combination of features in the appended claims, even if the feature or combination is not explicitly indicated per se in the claims or examples.

The invention claimed is:

1. A radiation-emitting semiconductor chip having a semiconductor body comprising a semiconductor layer sequence having an active region that generates radiation, a first semiconductor layer of a first conductor, and a second semiconductor layer of a second conductor different from the first conductor, and having a carrier on which the semiconductor body is arranged, wherein
   a pn junction is formed in the carrier,
   the carrier has a first contact and a second contact on a rear side facing away from the semiconductor body,
   the active region and the pn junction connect to one another in antiparallel in relation to the forward-bias direction by the first contact and the second contact, and
   the pn junction is formed in the carrier over its entire area.

2. The radiation-emitting semiconductor chip according to claim 1, wherein the pn junction is formed between a first subregion of the carrier and a second subregion of the carrier, and the first subregion is arranged between the semiconductor body and the second subregion.

3. The radiation-emitting semiconductor chip according to claim 2, wherein the carrier has an opening extending from the rear side of the carrier through the first subregion, the first subregion being electrically contacted by the opening.

4. The radiation-emitting semiconductor chip according to claim 1, wherein the first contact electrically conductively connects to the first semiconductor layer by a via through the carrier.

5. The radiation-emitting semiconductor chip according to claim 4, wherein the via extends through the pn junction.

6. A method of producing a multiplicity of radiation-emitting semiconductor chips comprising:
   a) providing a semiconductor layer sequence having an active region that generates radiation, a first semiconductor layer of a first conductor, and a second semiconductor layer of a second conductor different from the first conductor;
   b) fastening a carrier assembly in which a pn junction is formed on the semiconductor layer sequence;
   c) forming a multiplicity of vias from a rear side of the carrier assembly facing away from the semiconductor layer sequence through the carrier assembly;
   d) forming a multiplicity of first contacts and second contacts on the rear side of the carrier, the first contacts electrically conductively connected to the first semiconductor layer by the vias; and
   e) dividing the semiconductor layer sequence with the carrier assembly into semiconductor chips, the active region and the pn junction respectively connected to one another in antiparallel in relation to the forward-bias direction by the first contact and the second contact in the semiconductor chips,
   such that the pn junction extends over the entire area of the carrier assembly.

7. The method according to claim 6, wherein, before step b), first connection surfaces electrically conductively connected to the first semiconductor layer, are formed on the semiconductor layer sequence, and the first connection surfaces are exposed in step c).

8. The method according to claim 6, wherein the semiconductor layer sequence is covered over its entire area with a dielectric layer on a side facing toward the carrier assembly in step b).

9. The method according to claim 6, wherein the carrier assembly is fastened on the semiconductor layer sequence by direct bonding.

10. The method according to claim 6, wherein openings extending through the pn junction are formed from the rear side in the carrier assembly.

11. The method according to claim 10, wherein the openings have a smaller cross section than the vias in plan view so that the openings and the vias are configured during simultaneous production such that the vias extend through the carrier assembly and the openings end in the carrier assembly.

12. The method according to claim 6, wherein the pn junction extends parallel to the rear side of the carrier assembly, and the pn junction is arranged closer to a front side of the carrier assembly facing toward the semiconductor layer sequence than to the rear side of the carrier assembly in step b).

13. The method according to claim 6, wherein the carrier assembly is thinned from the rear side between step b) and step c).

14. A radiation-emitting semiconductor chip having a semiconductor body comprising a semiconductor layer sequence having an active region that generates radiation, a first semiconductor layer of a first conductor, and a second semiconductor layer of a second conductor different from the first conductor, and having a carrier on which the semiconductor body is arranged, wherein
 a pn junction is formed in the carrier,
 the carrier has a first contact and a second contact on a rear side facing away from the semiconductor body,
 the active region and the pn junction connect to one another in antiparallel in relation to the forward-bias direction by the first contact and the second contact,
 pn junction is formed over the entire area of the carrier between a first subregion and a second subregion of the carrier, the first subregion arranged between the semiconductor body and the second subregion, and
 the carrier comprises an opening extending from the rear side of the carrier through the second subregion and ending in the first subregion, and the first subregion electrically connects via the opening.

15. The radiation-emitting semiconductor chip according to claim 1, wherein the pn junction in plan view of the semiconductor chip extends over all of the carrier material.

16. The radiation-emitting semiconductor chip according to claim 1, wherein the pn junction extends parallel to the rear side of the carrier at any position of the pn junction.

17. The radiation-emitting semiconductor chip according to claim 14, wherein the opening does not extend fully through the carrier.

18. The radiation-emitting semiconductor chip according to claim 14, wherein the opening extends through the pn junction.

19. The radiation-emitting semiconductor chip according to claim 14, wherein the first contact electrically conductively connects to the first semiconductor layer by a via through the carrier wherein a cross section of the opening is smaller than a cross section of the via.

* * * * *